US012804822B2

(12) United States Patent
Ethridge et al.

(10) Patent No.: US 12,804,822 B2
(45) Date of Patent: Nov. 17, 2026

(54) SYSTEMS AND METHODS FOR GENERATING UNIFORM CIRCUIT BOARD THICKNESS

(71) Applicant: Dell Products L.P., Round Rock, TX (US)

(72) Inventors: Steven R Ethridge, Austin, TX (US); Sandor T. Farkas, Round Rock, TX (US); Bhyrav M. Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 215 days.

(21) Appl. No.: 18/485,825

(22) Filed: Oct. 12, 2023

(65) Prior Publication Data

US 2025/0126724 A1 Apr. 17, 2025

(51) Int. Cl.
*H05K 3/46* (2006.01)
*H05K 3/00* (2006.01)

(52) U.S. Cl.
CPC ......... *H05K 3/4614* (2013.01); *H05K 3/0047* (2013.01); *H05K 3/4679* (2013.01)

(58) Field of Classification Search
CPC .. H05K 3/4614; H05K 3/0047; H05K 3/4679; H05K 3/4611; H05K 1/0237; H05K 1/116; H05K 2201/09781; H05K 2203/308
See application file for complete search history.

(56) References Cited

U.S. PATENT DOCUMENTS 7,535,079 B2 * 5/2009 Remmel ................ H10D 86/85 257/532
7,605,460 B1 * 10/2009 Wu ...................... H05K 1/0265 257/691

(Continued)

FOREIGN PATENT DOCUMENTS

CN 116266972 A * 6/2023 ........... H05K 3/0047
EP 2405726 A2 * 1/2012 ............. H05K 3/429

OTHER PUBLICATIONS

Translation of CN-116266972-A (Year: 2023).*
Translation of EP-2405726-A2 (Year: 2012).*

*Primary Examiner* — Jeffrey T Carley
(74) *Attorney, Agent, or Firm* — Jackson Walker L.L.P.

(57) ABSTRACT

A circuit board may include a plurality of electrically-conductive layers and a plurality of electrically-insulative layers laminated together with the plurality of electrically-conductive layers such that each of the plurality of electrically-insulative layers is located between adjacent layers of the plurality of electrically-conductive layers. A first electrically-conductive layer of the plurality of electrically-conductive layers may be patterned, during a process step in the manufacture of the circuit board, to include an electrically-conductive pattern patterned to be electrically coupled to an electrically-conductive network within the circuit board and a nonfunctional pad comprising a portion of conductive material patterned from the first electrically-conductive layer but electrically decoupled from the electrically-conductive pattern. A first electrically-insulative layer of the plurality of electrically-insulative layers may be laminated over the first electrically-conductive layer such that resin of the first electrically-insulative layer fills a void between the electrically-conductive network and the non-functional pad.

4 Claims, 4 Drawing Sheets

(56) References Cited

U.S. PATENT DOCUMENTS

| | | | | |
|---|---|---|---|---|
| 9,368,563 | B2 * | 6/2016 | Lin | H01L 23/3121 |
| 10,201,085 | B2 * | 2/2019 | Iketani | H05K 1/115 |
| 10,319,681 | B2 * | 6/2019 | Hsieh | H10W 70/095 |
| 10,418,298 | B2 * | 9/2019 | Lin | H10W 74/121 |
| 11,380,666 | B2 * | 7/2022 | Tsai | H01L 23/5385 |
| 11,532,584 | B2 * | 12/2022 | May | H10W 20/40 |
| 2001/0040048 | A1 * | 11/2001 | Achari | H05K 3/4685 174/255 |
| 2002/0136873 | A1 * | 9/2002 | Li | H05K 3/4038 428/209 |
| 2005/0155791 | A1 * | 7/2005 | Saiki | H01L 23/49822 174/262 |
| 2006/0019505 | A1 * | 1/2006 | Cooper | B32B 37/02 156/154 |
| 2007/0175657 | A1 * | 8/2007 | Itoh | H05K 1/0271 174/260 |
| 2007/0194432 | A1 * | 8/2007 | Hsu | H05K 1/0222 257/E23.079 |
| 2011/0147069 | A1 * | 6/2011 | Quackenbush | H05K 1/183 174/266 |
| 2017/0142829 | A1 * | 5/2017 | Yu | H05K 3/4691 |
| 2022/0159824 | A1 * | 5/2022 | Wu | H01L 21/486 |

* cited by examiner

SYSTEMS AND METHODS FOR GENERATING UNIFORM CIRCUIT BOARD THICKNESS

TECHNICAL FIELD

The present disclosure relates in general to information handling systems, and more particularly to forming non-functional pads on a conductive layer of a circuit board during manufacturing to act as a filler in a conductive layer of the circuit board in order to minimize an amount of resin of an insulative layer that fills the conductive layer during manufacturing.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems may often use one or more circuit boards. A circuit board may comprise a substrate of a plurality of conductive layers separated and supported by layers of dielectric insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

Density of signal routing in circuit boards has been increasing with each new generation, motivating the use of thinner dielectric layers. Thinner dielectric layers may also minimize signal crosstalk.

FIG. 4 illustrates a cross-sectional side elevation view of selected components of a circuit board 400 during a process step in the manufacturing of circuit board 400, as is known in the art. As shown in FIG. 4, circuit board 400 may comprise a substrate of a plurality of conductive layers 402 (e.g., conductive layers 402*a*-402*f*) separated and supported by dielectric layers 404 (e.g., dielectric layers 404*a*-404*e*) laminated together, with conductive traces formed on and/or in any of such conductive layers 402. A dielectric layer 404 may be created with a core (e.g., as in dielectric layers 404*b* and 404*d*) or with a "prepreg" layer (e.g., as in dielectric layers 404*a*, 404*c*, and 404*e*). A core may be a rigid glass fiber material (e.g., cured FR-4) formed between conductive layers 402. A prepreg layer may be a layer of woven fiberglass cloth impregnated with an uncured epoxy resin binder that may be placed between cores, between a core and a conductive layer 402, or between conductive layers 402, and then cured to mechanically bind layers together.

Each conductive layer 402 may be made from a foil of conductive metal (e.g., copper). Nonfunctional pads, which may be provided to provide extra clearance between functional pads to prevent electrical shorting between functional pads of the same layer, may be formed during manufacturing and subsequently removed, resulting in a large antipad 406 or cavity that encourages prepreg flow and may result in cross-section geometry variations during lamination. To illustrate, when prepreg is used in areas adjacent to antipads 406 (e.g., regions in which vias may be formed), resin of an adjacent prepreg layer 404*a*, 404*c*, or 404*e* may fill regions of antipads 406. Such resin flow, shown by arrows in FIG. 4, may result in variations of dielectric thickness of a dielectric layer 404, which may lead to undesirable results.

SUMMARY

In accordance with the teachings of the present disclosure, the disadvantages and problems associated with existing approaches to mounting a circuit package to a printed circuit board may be reduced or eliminated.

In accordance with embodiments of the present disclosure, a circuit board may include a plurality of electrically-conductive layers and a plurality of electrically-insulative layers laminated together with the plurality of electrically-conductive layers such that each of the plurality of electrically-insulative layers is located between adjacent layers of the plurality of electrically-conductive layers. A first electrically-conductive layer of the plurality of electrically-conductive layers may be patterned, during a process step in the manufacture of the circuit board, to include an electrically-conductive pattern patterned to be electrically coupled to an electrically-conductive network within the circuit board and a nonfunctional pad comprising a portion of conductive material patterned from the first electrically-conductive layer but electrically decoupled from the electrically-conductive pattern. A first electrically-insulative layer of the plurality of electrically-insulative layers may be laminated over the first electrically-conductive layer such that resin of the first electrically-insulative layer fills a void between the electrically-conductive network and the nonfunctional pad.

In accordance with these and other embodiments of the present disclosure, a method for forming a circuit board may include laminating a plurality of electrically-conductive layers and a plurality of electrically-insulative layers such that each of the plurality of electrically-insulative layers is located between adjacent layers of the plurality of electrically-conductive layers and patterning, during a process step in the manufacture of the circuit board, a first electrically-conductive layer of the plurality of electrically-conductive layers to include an electrically-conductive pattern patterned to be electrically coupled to an electrically-conductive network within the circuit board a nonfunctional pad comprising a portion of conductive material patterned from the first electrically-conductive layer but electrically decoupled from the electrically-conductive pattern. The method may also include laminating, during another process step in the process step in the manufacture of the circuit board, a first electrically-insulative layer of the plurality of electrically-insulative layers over the first electrically-conductive layer such that resin of the first electrically-insulative layer fills a void between the electrically-conductive network and the nonfunctional pad.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
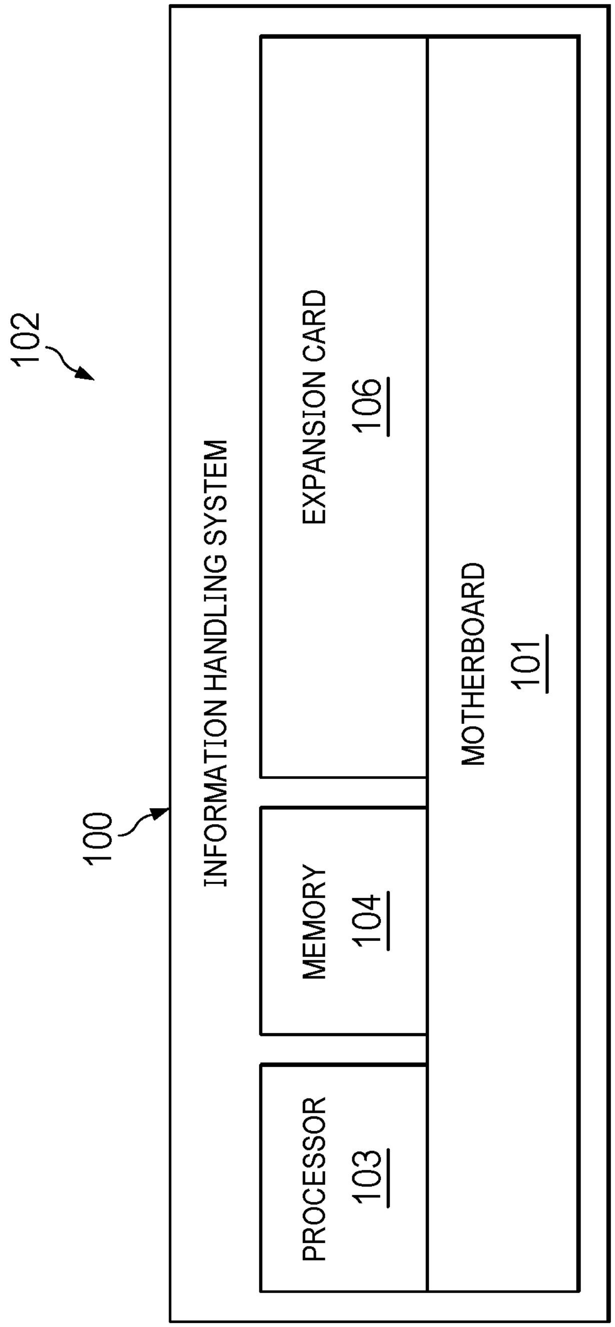
FIG. 1 illustrates a block diagram of selected components of an example information handling system, in accordance with embodiments of the present disclosure.
Figure 2:
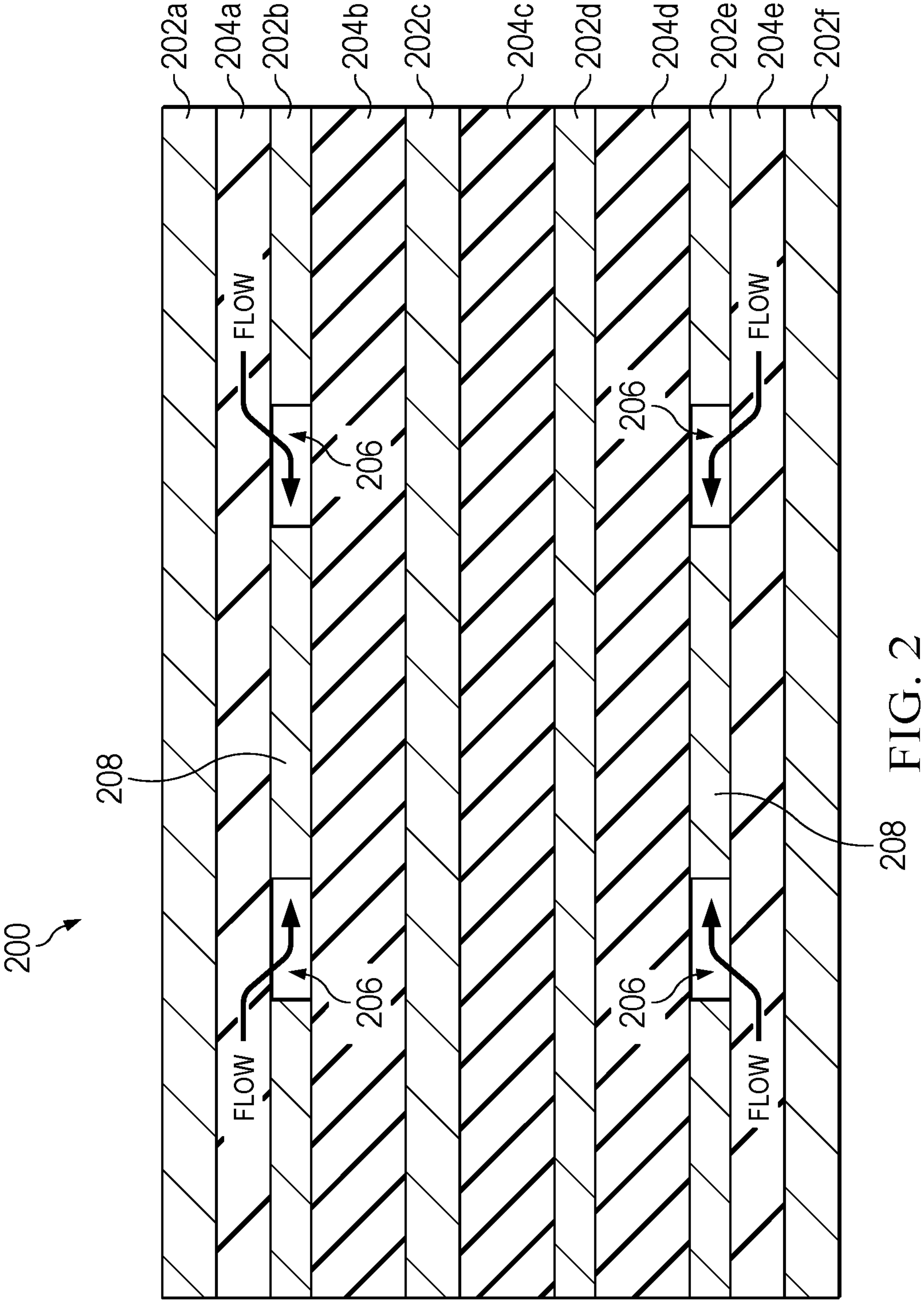
FIG. 2 illustrates a cross-sectional side elevation view of selected components of a circuit board during a process step in the manufacturing of the circuit board, in accordance with embodiments of the present disclosure.
Figure 3:
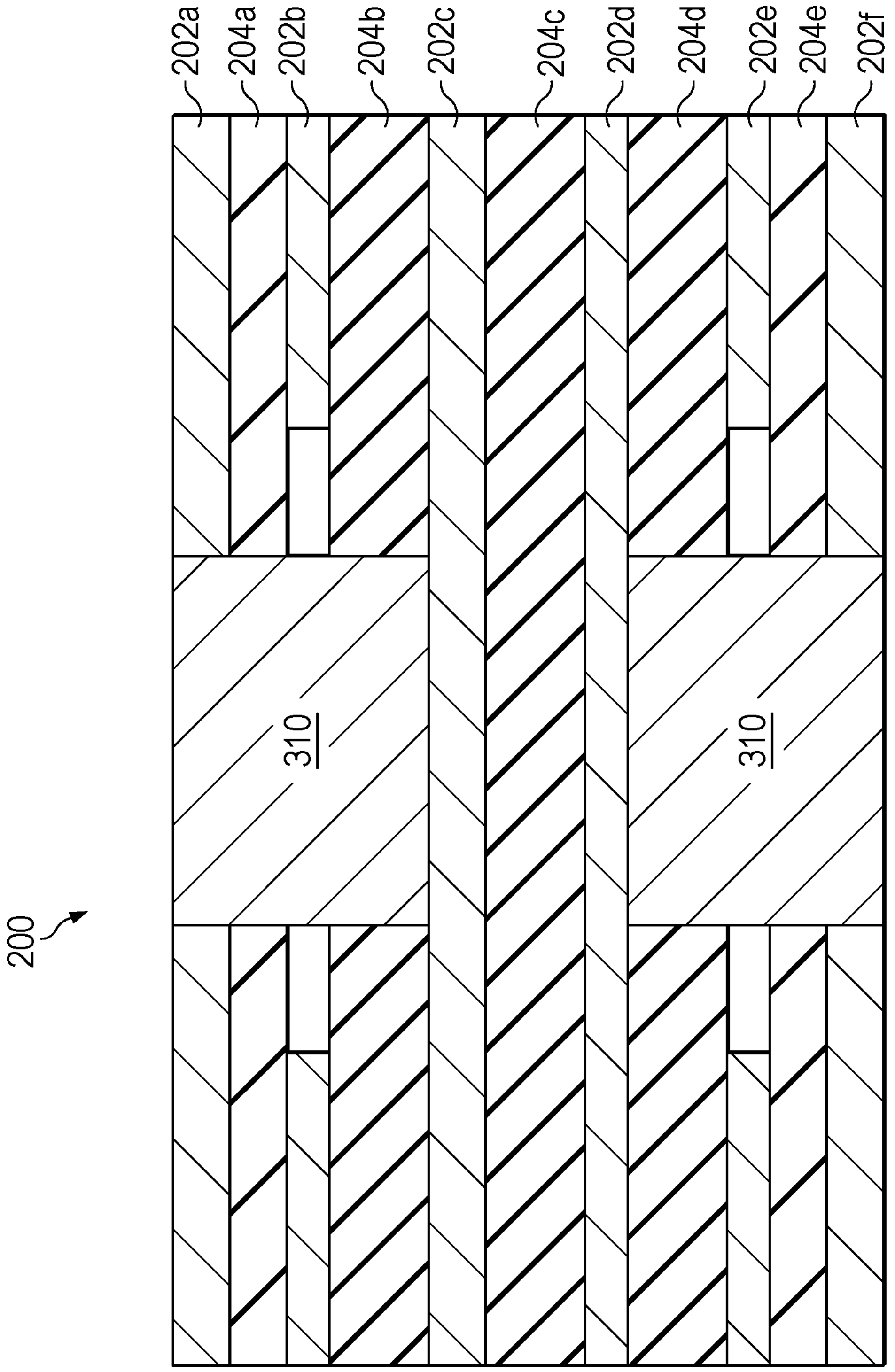
FIG. 3 illustrates a cross-sectional side elevation view of selected components of a circuit board during another process step in the manufacturing of the circuit board, in accordance with embodiments of the present disclosure.
Figure 4:
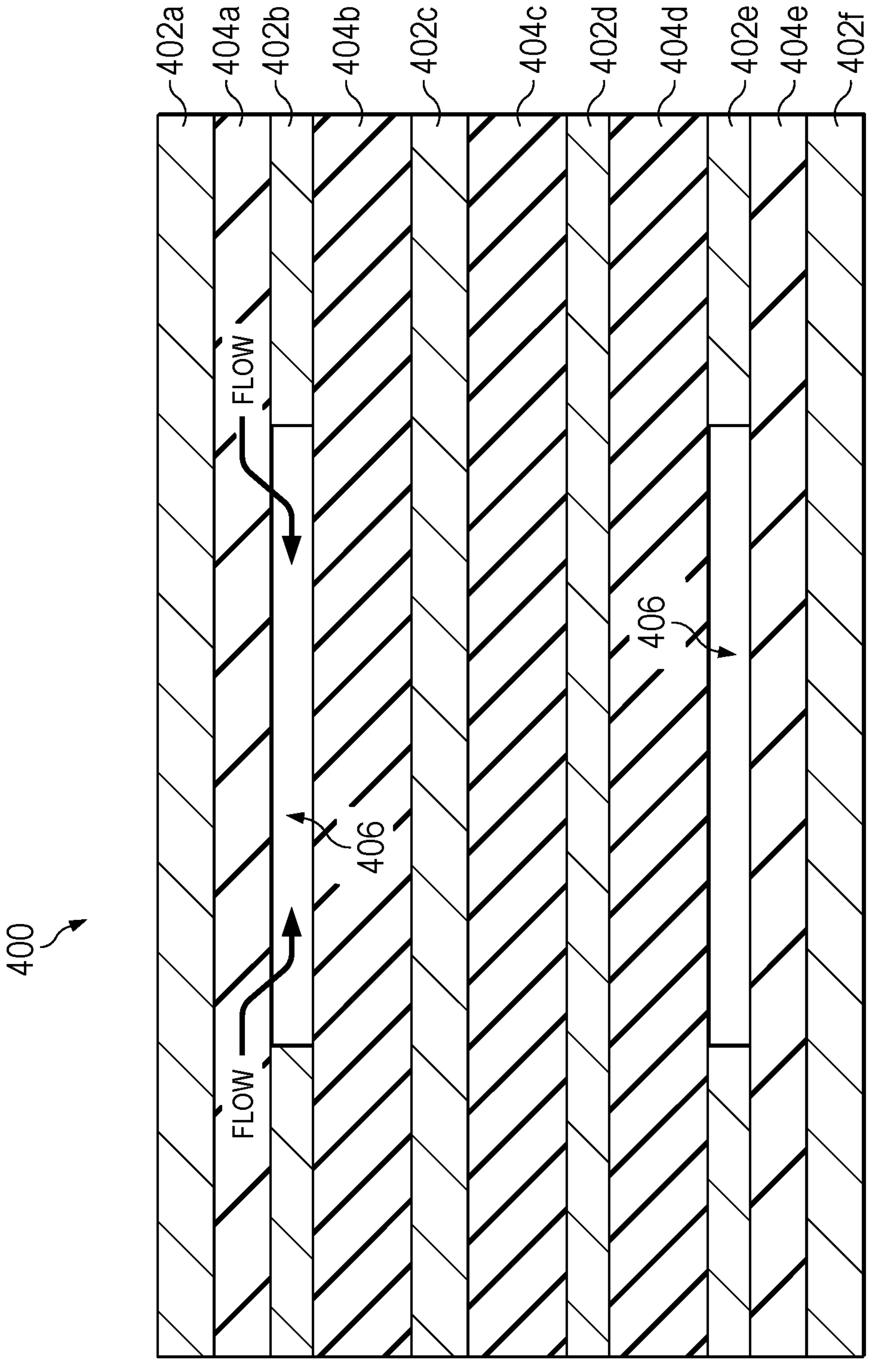
FIG. 4 (PRIOR ART)
FIG. 4 illustrates a cross-sectional side elevation view of selected components of a circuit board during a process step in the manufacturing of the circuit board, as is known in the art.

Preferred embodiments and their advantages are best understood by reference to FIGS. 1 through 3 wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU"), microcontroller, or hardware or software control logic. Additional components of the information handling system may include one more or devices, storage one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, and/or any other components and/or elements of an information handling system.

For the purposes of this disclosure, circuit boards may broadly refer to printed circuit boards (PCBs), printed wiring boards (PWBs), printed wiring assemblies (PWAs), etched wiring boards, and/or any other board or similar physical structure operable to mechanically support and electrically couple electronic components (e.g., packaged integrated circuits, slot connectors, etc.). A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

FIG. 1 illustrates a block diagram of selected components of an example information handling system 102. In some embodiments, information handling system 102 may comprise a server. In other embodiments, information handling system 102 may comprise networking equipment for facilitating communication over a communication network. In yet other embodiments, information handling system 102 may comprise a personal computer, such as a laptop, notebook, or desktop computer.

As shown in FIG. 1, information handling system 102 may include a chassis 100 that houses a motherboard 101, a processor 103 coupled to motherboard 101, a memory 104 coupled to motherboard 101, and an expansion card 106 mechanically and electrically coupled to motherboard 101.

Chassis 100 may include any suitable housing or enclosure configured to house the various components of information handling system 102, and may be constructed from metal, plastic, and/or any other suitable material.

Motherboard 101 may comprise a circuit board configured to provide structural support for one or more information handling resources of information handling system 102 and/or electrically couple one or more of such information handling resources to each other and/or to other electric or electronic components external to information handling system 102.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in a storage resource, memory system 104, and/or another component of information handling system 102.

Memory 104 may be communicatively coupled to processor 103 and may comprise any system, device, or apparatus operable to retain program instructions or data for a period of time (e.g., computer-readable media). Memory 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off. In particular embodiments, memory 104 may comprise dynamic random access memory (DRAM).

Expansion card 106 may comprise any suitable circuit board. In some embodiments, expansion card 106 may comprise a riser card.

In addition to motherboard 101, processor 103, memory 104, and expansion card 106, information handling system 102 may include one or more other information handling resources.

FIG. 2 illustrates a cross-sectional side elevation view of selected components of a circuit board 200 during a process step in the manufacturing of the circuit board 200, in accordance with embodiments of the present disclosure. In some embodiments, a circuit board manufactured using a process step such as that shown in FIG. 2 may be used to implement, in whole or part, motherboard 101, memory 103, expansion card 106, and/or another suitable circuit board.

As shown in FIG. 2, circuit board 200 may comprise a substrate of a plurality of conductive layers 202 (e.g., conductive layers 202*a*-202*f*) separated and supported by dielectric layers 204 (e.g., dielectric layers 204*a*-204*e*) laminated together, with conductive traces formed on and/or in any of such conductive layers 202. A dielectric layer 204 may be created with a core (e.g., as in dielectric layers 204*b* and 204*d*) or with a "prepreg" layer (e.g., as in dielectric layers 204*a*, 204*c*, and 204*e*). A core may be a rigid glass fiber material (e.g., cured FR-4) formed between conductive layers 202. A prepreg layer may be a layer of uncured woven fiberglass cloth with an epoxy resin binder that may be placed between cores, between a core and a conductive layer 202, or between conductive layers 202, and then cured to mechanically bind layers together.

Each conductive layer 202 may be made from a foil of conductive metal (e.g., copper). As shown in FIG. 2, to provide desired routing of signals, one or more of conductive layers 202 may be patterned to remove portions of such conductive layers 202, thus leaving behind antipads 206 and nonfunctional pads 208. A nonfunctional pad 208 may be a portion of conductive material patterned from its associated conductive layer 202, but electrically decoupled from an electrically-conductive pattern on such conductive layer 202. As used herein, "electrically-conductive pattern" means a portion of a conductive layer 202 that is patterned to be electrically coupled to (as opposed to electrically insulated from) an electrically-conductive network within circuit board 200.

Rather than removing nonfunctional pads 208 during manufacture prior to adding adjacent prepreg layers, as is typically the case in traditional approaches, such nonfuctional pads may remain while adjacent prepreg layers are formed. When prepreg is used in areas adjacent to antipads 206 (e.g., regions in which vias may be formed), resin of an adjacent prepreg layer 204*a*, 204*c*, or 204*e* may fill regions of antipads 206, as shown by arrows in FIG. 2. However, due to the presence of nonfunctional pads 208, circuit board 200 may experience a smaller volume of resin flow from a prepreg layer into antipads 206 as compared to existing approaches in which nonfunctional pads 208 are not present to partially fill the antipad volume.

FIG. 3 illustrates a cross-sectional side elevation view of selected components of circuit board 200 during another process step in the manufacturing of circuit board 200 occurring after the process step shown in FIG. 2, in accordance with embodiments of the present disclosure. As shown in FIG. 3, during the manufacturing of circuit board 200, vias 310 may be formed in circuit board 200 to couple traces of different conductive layers 202 to one another. To form vias 310, via holes may be drilled in circuit board 200 at the desired locations and depths for vias 310, and conductive material (e.g., copper) deposited in such via holes to form vias 310. The diameters or widths of nonfunctional pads may be smaller than the diameters of the via holes, such that the drilling of via holes may remove nonfunctional pads 208, thus preventing electrical shorts from being caused by nonfunctional pads 208.

For purposes of clarity and exposition, resin flow from prepreg layers 204*a* and 204*e* into antipads 206 is not shown in FIG. 3, although such regions of antipads 206 may be fully or partially filled with resin of adjacent prepreg layers 204*a* and 204*e* at the time of the process step shown in FIG. 3.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112 (f) unless the words "means for" or "step for" are explicitly used in the particular claim.

What is claimed is:

1. A method for forming a circuit board, comprising:

patterning a first electrically-conductive layer of a plurality of electrically-conductive layers to include:

an electrically-conductive pattern patterned to be electrically coupled to an electrically-conductive network within the circuit board; and a nonfunctional pad centered at an intended location of an intended via hole in the circuit board, wherein:

the nonfunctional pad has a pre-drill width smaller than a width of the intended via hole configured to accommodate the via;

the nonfunctional pad comprises a portion of conductive material patterned from the first electrically-conductive layer but electrically decoupled from the electrically-conductive network; and the nonfunctional pad and the electrically-conductive pattern are coplanar within the first electrically-conductive layer and laterally separated by a void region of the first electrically-conductive layer;

laminating, after the patterning of the first electrically-conductive layer, a first electrically-insulative layer of a plurality of electrically-insulative layers over the first electrically-conductive layer such that:

resin of the first electrically-insulative layer fills the void region between the electrically-conductive pattern and the nonfunctional pad; and each of the plurality of electrically-insulative layers is located between adjacent layers of the plurality of electrically-conductive layers, thereby laminating the plurality of electrically-conductive layers and plurality of electrically-insulative layers together; and then drilling a via hole in the circuit board to entirely remove the nonfunctional pad.

2. The method of claim 1, wherein the plurality of electrically-conductive layers comprise copper.

3. The method of claim 1, wherein the plurality of electrically-insulative layers comprise at least one core layer and at least one resin-prepregnated layer.

4. The method of claim 1, further comprising depositing an electrically-conductive via in the via hole.

* * * * *